United States Patent
Kim et al.

(10) Patent No.: US 9,911,906 B2
(45) Date of Patent: Mar. 6, 2018

(54) LIGHT EMITTING DEVICE PACKAGE

(71) Applicant: LG INNOTEK CO., LTD., Seoul (KR)

(72) Inventors: Won Jin Kim, Seoul (KR); Jin Gyeong Park, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/019,210

(22) Filed: Feb. 9, 2016

(65) Prior Publication Data

US 2016/0240745 A1 Aug. 18, 2016

(30) Foreign Application Priority Data

Feb. 12, 2015 (KR) .................. 10-2015-0021552

(51) Int. Cl.
| | | |
|---|---|---|
| *H01L 33/00* | (2010.01) | |
| *H01L 33/50* | (2010.01) | |
| *H01L 33/56* | (2010.01) | |
| *H01L 33/46* | (2010.01) | |

(52) U.S. Cl.
CPC .............. *H01L 33/50* (2013.01); *H01L 33/56* (2013.01); *H01L 33/46* (2013.01); *H01L 2224/4809* (2013.01); *H01L 2224/48091* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 2006/0243996 | A1* | 11/2006 | Ueda | ............... H01L 33/56 257/98 |
| 2007/0228391 | A1 | 10/2007 | Minami et al. | |
| 2012/0080701 | A1* | 4/2012 | Kim | ............... H01L 33/486 257/98 |
| 2013/0070441 | A1 | 3/2013 | Moon et al. | |
| 2013/0078411 | A1* | 3/2013 | Gaska | ............... C09D 163/00 428/68 |

(Continued)

FOREIGN PATENT DOCUMENTS

| | | |
|---|---|---|
| CN | 101047220 | 10/2007 |
| CN | 105895789 | 8/2016 |

(Continued)

OTHER PUBLICATIONS

Chinese Search Report dated Sep. 25, 2017 issued in Application No. 201610084972.2.

(Continued)

*Primary Examiner* — Ali Naraghi
(74) *Attorney, Agent, or Firm* — KED & Associates, LLP

(57) ABSTRACT

A light emitting device package is provided. The light emitting device package may include a package body, a circuit pattern on the package body, a light emitting chip on the circuit pattern, a connector to connect the light emitting chip to the circuit pattern, a phosphor layer on the light emitting chip, and a first protective layer including a Group III nitride provided on the package body to cover the circuit pattern, the light emitting chip, and the connecting member.

15 Claims, 10 Drawing Sheets

(56) References Cited

U.S. PATENT DOCUMENTS

2014/0209947 A1* 7/2014 Cho .................. H01L 25/0753
257/98
2016/0240745 A1 8/2016 Kim et al.

FOREIGN PATENT DOCUMENTS

| JP | 2006-140207 A | 6/2006 |
| KR | 10-2009-0063054 A | 6/2009 |
| KR | 10-2013-0031087 A | 3/2013 |

OTHER PUBLICATIONS

Chinese Office Action dated Oct. 9, 2017 issued in Application No. 201610084972.2 (with English translation).

* cited by examiner (a)

(b)

(c)

LIGHT EMITTING DEVICE PACKAGE

CROSS-REFERENCE TO RELATED APPLICATION

This application claims priority under 35 U.S.C. § 119 to Korean Application No. 10-2015-0021552 filed on Feb. 12, 2015, whose entire disclosure is incorporated herein by reference.

BACKGROUND

1. Field

Embodiments relate to a light emitting device and a light unit including the light emitting device.

2. Background

Light emitting devices, for example, light emitting diodes (LEDs), are semiconductor devices that convert electric energy into light and may be next-generation light sources in place of fluorescent lamps and glow lamps. As LEDs generate light using the semiconductor devices, LEDs may have low power consumption compared to glow lamps that generate light by heating tungsten or fluorescent lamps that generate light by urging ultraviolet rays, which may be generated through high-voltage discharge, to collide with a fluorescent substance.

LEDs may also be advantageous compared to other light sources in terms of life span, response characteristics, and environmental friendliness. Various studies have been performed to replace these light sources with LEDs, which are increasingly used as light sources for lighting devices, such as, e.g., various lamps used indoors and outdoors, liquid crystal displays, electric signboards, and street lamps.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
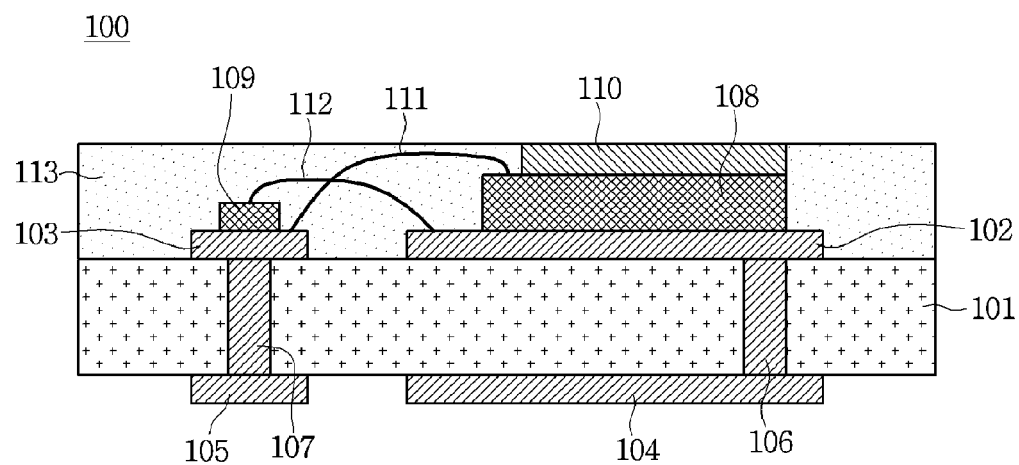
FIG. 1 is a sectional view of a light emitting device package according to a first embodiment.

FIG. 1 is a sectional view of a light emitting device package according to a first embodiment. The light emitting device package 100 may include a package body 101, first to fourth circuit patterns 102 to 105, first and second vias 106 and 107, a light emitting chip 108, a zener diode 109, a phosphor layer 110, first and second connecting members 111 and 112 and a protective layer 113. The package body 101 may include a ceramic insulating layer, but the embodiment is not limited thereto. The ceramic insulating layer constituting the package body 101 may include nitride or oxide. For example, the package body 101 may include $SiO_2$, $Si_xO_y$, $Si_3N_4$, $Si_xN_y$, $SiO_xN_y$, $Al_2O_3$ or AlN, but the embodiment is not limited thereto.

The package body 101 may be formed of at least one of a resin-based printed circuit board (PCB), a silicon-based material, such as, e.g., silicon or silicon carbide, a ceramic-based material, such as, e.g., aluminum nitride (AlN), a resin-based material, such as, e.g., polyphthalamide (PPA) and liquid crystal polymer, and a metal core PCB (MCPCB), but the embodiment is not limited thereto. The package body 101 may include a material having excellent thermal conductivity and may be a substrate in which a plurality ceramic sheets may be multi-layered in a height direction.

The first and second circuit patterns 102 and 103 may be formed on a top surface of the package body 101, respectively, while being spaced apart from each other by a predetermined interval. The third and fourth circuit patterns 104 and 105 may be formed on a bottom surface of the package body 101, respectively, while being spaced apart from each other by a predetermined interval.

The first via 106 may pass through the top and bottom surfaces of the package body 101 such that a top end of the first via 106 may be connected to a bottom surface of the first circuit pattern 102 and a bottom end of the first via 106 may be connected to a top surface of the third circuit pattern 104. The second via 107 may pass through the top and bottom surfaces of the package body 101 such that a top end of the second via 107 may be connected to a bottom surface of the second circuit pattern 103 and a bottom end of the second via 107 may be connected to a top surface of the fourth circuit pattern 105.

The first to fourth circuit boards 102 to 105 may be formed in a printed circuit board process of manufacturing, such as, e.g., an additive process, a subtractive process, a modified semi-additive process (MSAP) or a semi-additive process (SAP), but the embodiment is not limited thereto and details thereof have been omitted.

After via holes are formed in the package body 101 by penetrating the package body 101 with a laser, the via holes may be filled with a metallic material so that the first and second vias 106 and 107 may be formed. The metallic material to form the first and second vias 106 and 107 may be one selected from Cu, Ag, Sn, Au, Ni and Pd, and filling the metallic material may be performed through one of an electroless plating scheme, a screen printing scheme, a sputtering scheme, an evaporation scheme, an electric plating scheme and dispensing scheme, or a combination thereof.

The via hole may be formed through one of a mechanical, a laser and a chemical process. When the via hole is formed through the mechanical process, a scheme, such as, e.g., a milling scheme, a drilling scheme or a routing scheme, may be used. When the via hole is formed through a laser process, an UV or $CO_2$ laser scheme may be used. When the via hole is formed through the chemical process, chemicals, such as, e.g., aminosilane or ketones, may be used to penetrate the package body 101.

The laser process, which may be a cutting process to obtain a desired shape by concentrating optical energy on a surface of a material to partially melt the material, may process a complex shape according to a computer program. A complex material that may be difficult to cut may be processed through other schemes. The laser process has a cuttable diameter of at least 0.005 mm and a large range of processing thicknesses. Yttrium aluminum garnet (YAG), $CO_2$ or ultraviolet laser may be used as the laser process drill. The YAG laser may process all of a copper thin layer and an insulating layer, and the $CO_2$ laser may process only the insulating layer.

The first and second vias 106 and 107 may be formed of metal slug, for example, an aluminum ally slug. The third and fourth circuit patterns 104 and 105 may be formed to serve as an external terminal and may be connected to an external circuit, for example, a printed circuit substrate, to allow electric power to be input therethrough. Each of the first to fourth circuit patterns 102 to 105 may be formed of at least one of Ti, Cu, Ni, Au, Cr, Ta, Pt, Sn, Ag, P and a selective alloy thereof and may be formed in a single metal layer or a multiple metal layer.

The light emitting chip 108 may be provided on the first circuit pattern 102. The zener diode 109 may be provided on the second circuit pattern 103. The light emitting chip 108 may be electrically connected to the second circuit pattern 103 through the first connecting member 111. In addition, the zener diode 109 may be electrically connected to the first circuit pattern 102 through the second connecting member 112. The first and second connecting member 111 and 112 may be metallic wires. Alternatively, the light emitting chip 108 and the zener diode 109 may be bonded in a flip bonding manner.

The light emitting chip 108 may emit light selected from an ultraviolet band light to a visible band light. For example, the light emitting chip 108 may include a color LED chip, such as, e.g., an UV LED chip, a red LED chip, a blue LED chip, a green LED chip or a yellow green LED chip. For example, the light emitting chip 108 may be a blue LED chip. The light emitting chip 108 may be configured as a vertical type, in which P and N electrodes may be formed on top and bottom surfaces thereof, respectively, but the embodiment is not limited thereto. The light emitting chip 108 may be configured as a horizontal type, in which all the P and N electrodes may be formed on a top surface thereof and wire-bonded to a circuit pattern through metallic wires, respectively.

The phosphor layer 110 may be provided on the light emitting chip 108. A width of the phosphor layer 110 may be narrower than a width of the light emitting chip 108 so that a space in which the first connecting member 111 may be formed. A top surface of the phosphor layer 110 may be exposed to an outside so that a part or portion of the light emitted from the light emitting chip 108 may be converted to generate light having another wavelength. Alternatively, the top surface of the phosphor layer 110 may be covered by the protective layer 113. The phosphor layer 110 may be a ceramic based material and may include a metal oxide, such as, e.g., $Al_2O_3$, or glass. The phosphor added to the phosphor layer 110 may include at least one of red phosphor, green phosphor, blue phosphor and yellow phosphor. For example, the phosphor may be selected from YAG, TAG, silicate, nitride and oxy-nitride based materials.

The protective layer 113 may be formed on the package body 101. The protective layer 113 may be formed on the package body 101 to bury or cover the first and second circuit patterns 102 and 103, the light emitting chip 108, the zener diode 109, and the first and second connecting members 111 and 112 and to cover at least a part or portion of the phosphor layer 110. The protective layer 113 may be formed of thermal optical transparent resin, such as, e.g., silicon or epoxy, to protect and surround the first and second circuit patterns 102 and 103, the light emitting chip 108, the zener diode 109, the first and second connecting members 111 and 112, and at least a part of the phosphor layer 110.

Although an upper part or portion of the protective layer 113 is depicted in the drawings to be flatly formed, the embodiment is not limited thereto, and the upper part of the protective layer 113 may have a dome shape. The protective layer 113 may protect the above-described elements and reflect light leaked from the light emitting chip 108 in a side direction such that the leaked light may be induced to the phosphor layer 110. Thus, the protective layer 113 may be formed of a material having high reflectance.

The base material constituting the protective layer 113 may be white silicon, but reflectance of the white silicon may be low. Thus, the protective layer 113 may be formed of a material obtained by mixing silicon with a material having excellent reflection and heat dissipation characteristics, for example, $TiO_2$ may be used as the mixed material. Since $TiO_2$ has good heat radiation and heat dissipation characteristics, heat generated from the light emitting chip 108 may be effectively dissipated and the light generated from the light emitting chip 108 may be induced toward the phosphor layer 110.

An internal energy conversion ratio of the light emitting chip 108 may be equal to or less than about 15%, so that the remaining electric energy of 85% may be converted into heat. Thus, effectively dissipating the heat energy generated from the light emitting chip 108 may be very important. However, although $TiO_2$ dissipates the heat energy, $TiO_2$ may have no effective and sufficient heat energy dissipation characteristics and electrical discharge functions.

Therefore, according to the embodiment, the protective layer 113 may be formed of a Group III nitride. The protective layer 113 may be formed of a composite of silicon resin and the Group III nitride. The Group III nitride may include at least one of boron nitride (BN) and AlN. BN is a compound of B that may have a crystal structure similar to a crystal structure of graphite and N. BN may have a crystal structure almost equal to a crystal structure of graphite by combining B and N at a ratio of 1:1. Since BN has an ionic-bonding ratio greater than that of graphite and has no metallic bonding, BN may have no free electron(s), electric insulation, and a white color. In addition, the BN may be physically easily workable. Although BN is oxidized into $B_2O_3$ at a temperature of about 600° C. in air, BN may be heat resistant to 2,000° C. or more in a $N_2$ atmosphere, and a strength and electric insulation of BN may not be greatly lowered under the high temperature.

In addition, AlN may have excellent thermal conductivity, electric insulation and chemical resistance. For example, AlN has a thermal expansion coefficient very close to a thermal expansion coefficient of silicon, which may be used as a semiconductor material, so that compatibility with silicon may be excellent. Thus, according to the embodiment, the protective layer 113 may be formed by adding at least one Group III nitride of BN and AlN to silicon resin. The protective layer 113 may be formed of a composite of at least one Group III nitride of BN and AlN so that the light extraction efficiency of the light emitting chip 108 may enhance luminous flux (brightness), and heat radiation and electrical discharge resistance may be improved.

In other words, since BN is a high reflective material, light extraction efficiency may be improved. Since BN is a high thermal dissipation material, a heat radiation effect may be increased. In addition, since the BN is an insulating material, electrical discharge resistance may be improved. According to the embodiment, as described above, the protective layer 113 is formed of a composite of at least one Group III nitride of silicon resin, BN and AlN, so that the light extraction efficiency, the heat radiation property and the electrical discharge resistance may be improved.

Figure 2:
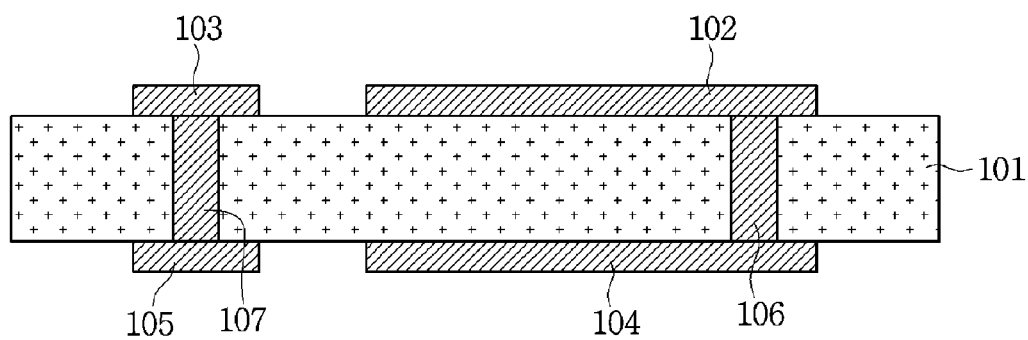
FIGS. 2 to 6 are sectional views sequentially illustrating a method of manufacturing a light emitting device package according to the first embodiment.

FIGS. 2 to 6 are sectional views sequentially illustrating a method of manufacturing a light emitting device package according to the first embodiment. Referring to FIG. 2, the package body 101 may be prepared first, and the first and second circuit patterns 102 and 103 may be formed on the top surface of the prepared package body 101, respectively. The package body 101 may be formed of at least one of a resin-based printed circuit board (PCB), a silicon-based material such as silicon or silicon carbide, a ceramic-based material such as aluminum nitride (AlN), a resin-based material such as polyphthalamide (PPA) and liquid crystal polymer, and a metal core PCB (MCPCB), but the embodiment is not limited thereto.

The first and second circuit boards 102 and 103 may be formed in a printed circuit board manufacturing process, such as, e.g., an additive process, a subtractive process, a modified semi-additive process (MSAP) or a semi-additive process (SAP). Then, the first via 106 connected to the first circuit pattern 102 and the second via 107 connected to the second circuit pattern 103 may be formed in the package body 10. Thereafter, the third circuit pattern connected to the first via 106 and the fourth circuit pattern 105 connected to the second via 107 may be formed on the bottom surface of the package body 101, respectively.

Figure 3:
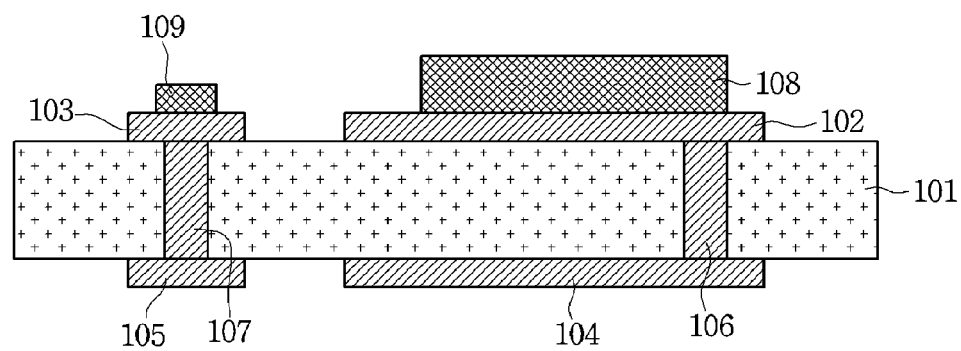

Referring to FIG. 3, the light emitting chip 108 may be attached onto the first circuit pattern 102, and the zener diode 109 may be attached onto the second circuit pattern 103. The zener diode 109 may prevent the light emitting chip 108 from being damaged by an over-voltage. The light emitting chip 108 may be configured as a vertical type, where the P and N electrodes are formed on top and bottom surfaces thereof, respectively, but the embodiment is not limited thereto.

Figure 4:
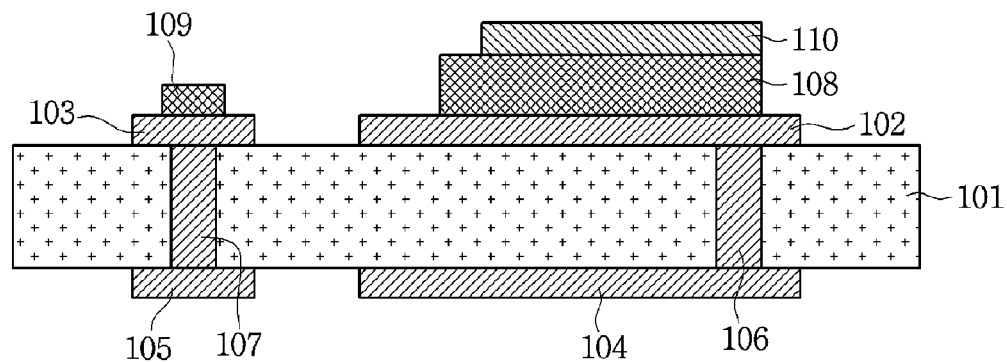

Referring to FIG. 4, the phosphor layer 110 may be formed on the light emitting chip 108. The phosphor layer 110 may be a ceramic based material and include a metal oxide, for example, $Al_2O_3$, or glass. The phosphor added to the phosphor layer 110 may include at least one of red phosphor, green phosphor, blue phosphor and yellow phosphor. For example, the phosphor may be selected from YAG, TAG, silicate, nitride and oxy-nitride based materials.

Figure 5:
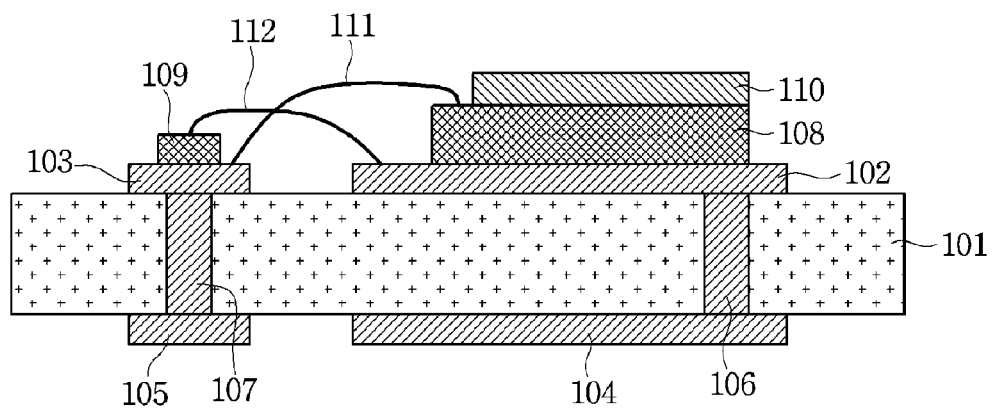

Referring to FIG. 5, by performing a wire bonding process, the first connecting member 111 that electrically connects the light emitting chip 108 to the second circuit pattern 103 may be formed. In addition, the second connecting member 112 that electrically connects the zener diode 109 to the first circuit pattern 102 may be formed.

Figure 6:
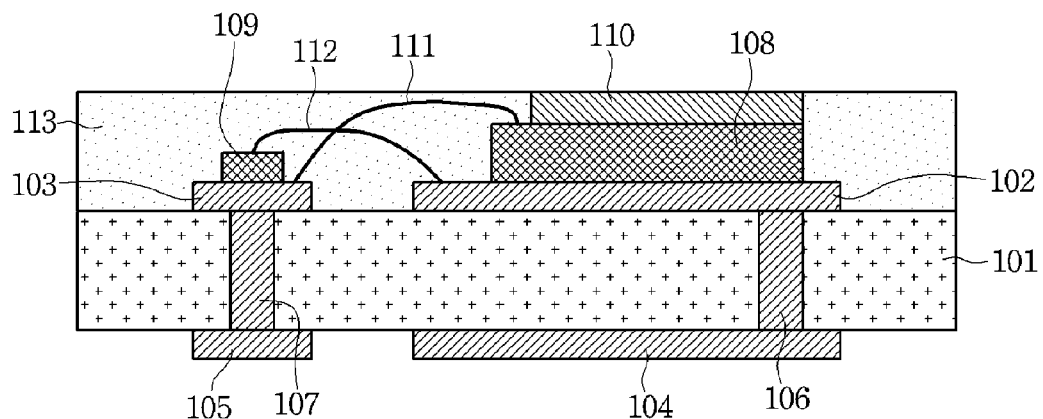

Referring to FIG. 6, the protective layer 113 may be formed on the package body 101. The protective layer 113 may be formed by mixing silicon resin with powder of at least one Group III nitride of BN and AlN and dispensing the mixture. The light reflectance of the protective layer 113 may vary with the content of the Group III nitride. In the embodiment, BN was used as the Group III nitride.

Figure 7:
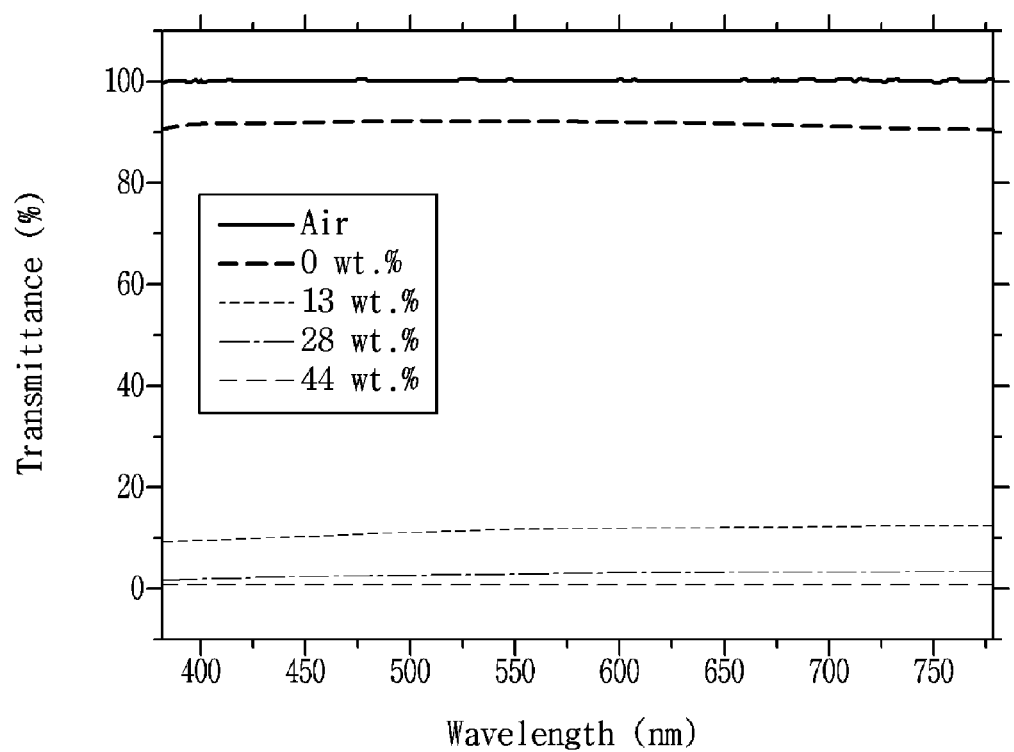
FIG. 7 is a graph showing transmittance of light according to a content of BN.

FIG. 7 is a graph showing transmittance of light according to a content of BN. Referring to FIG. 7, although the transmittance of light varies over wavelength bands, transmittance in air may be equal to or more than 99%. When silicon resin is solely used, transmittance may be equal to or more than 91%. When 13 wt % of BN is provided, transmittance may be about 11%. When 28 wt % of BN is provided, transmittance may be about 2%. When 44 wt % of BN is provided, transmittance may be about 1%.

A transmittance (or reflectance) of the protective layer 113 may vary according to the content of BN and transmittances in each wavelength band are shown in Table 1.

TABLE 1

| Classification | Air | silicon resin only | Content of BN | | | |
|---|---|---|---|---|---|---|
| | | | 13 wt % | 28 wt % | 30 wt % | 44 wt % |
| Transmittance (%) @500~750 nm | 99.98 | 91.66 | 11.41 | 2.73 | 1.98 | 0.69 |
| Transmittance (%) @380~780 nm | 99.98 | 91.54 | 11.38 | 2.72 | 1.97 | 0.70 |
| Transmittance (%) @550 nm | 100.01 | 92.09 | 11.56 | 2.74 | 1.99 | 0.65 |

As shown in Table 1, when 28 wt % or more of BN is mixed, transmittance is less than 3%, so light may be reflected in a whole of a visible light band. In addition, when BN of 30 wt % or more is mixed, transmittance is less than 2% and reflectance is 98% or more. Thus, when BN is used as the Group III nitride, at least 30 wt % of BN may be mixed with the silicon resin to prepare a material to be used for forming the protective layer 113. In this case, a grain size of BN may be in a range of 10~25 μm based on d50. A white mold may be shaped by dispensing the mixed material. When the mixed material is dispensed, a height of the mixed material may be adjusted to prevent the mixed material from covering the top surface of the phosphor layer 110 while burying or covering all the connecting members in the protective layer 113.

Thereafter, the protective layer 113 formed as described above may be hardened. The hardening operation may be performed at 100° C. for 10 minutes, at 120° C. for 10 minutes and, lastly, at 150° C. for 2 hours. When the hardening operation is completed, the protective layer 113, which may effectively dissipate the heat generated from the vertical-type light emitting chip 108 and increase reflectance, may be completely formed.

Figure 8:
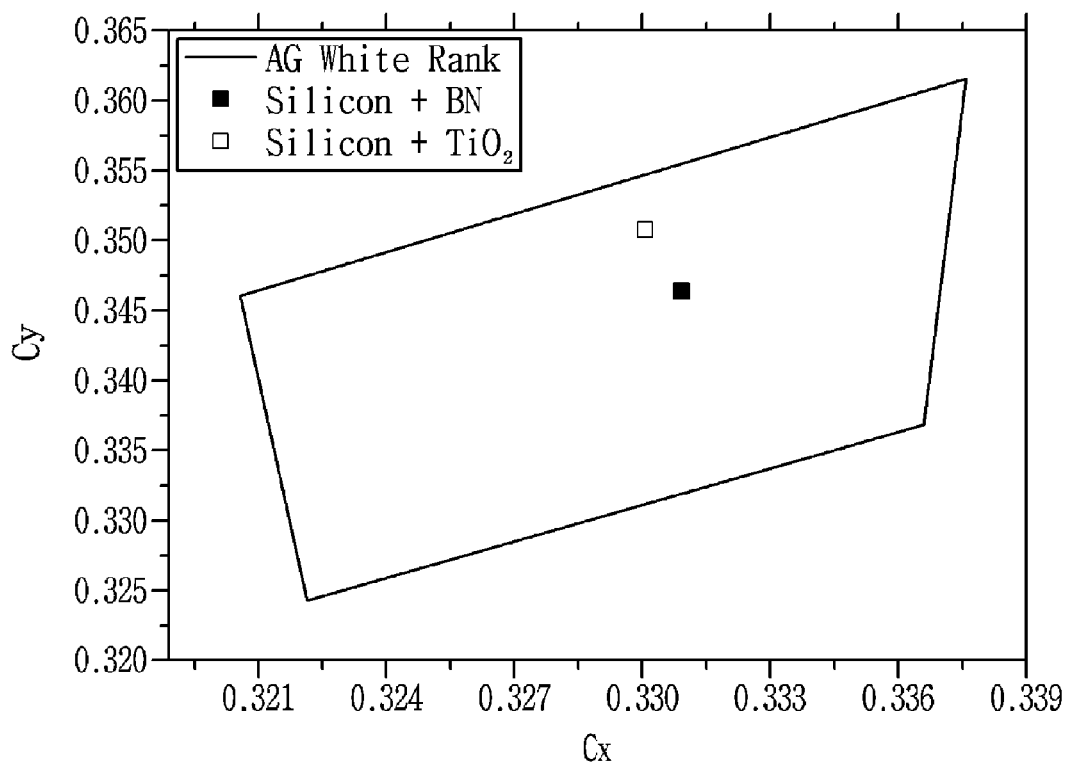
FIG. 8 is a graph showing measured results of luminous flux of a protective layer according to an embodiment.

FIG. 8 is a graph showing luminous flux measurement results of the protective layer according to an embodiment. Referring to FIG. 8, luminous fluxes when applying $TiO_2$ and BN of Group III nitride may be different from each other. That is, luminous flux may be increased by 7% when applying BN instead of $TiO_2$. The luminous flux measurement results are shown in Table 2.

TABLE 2

| | Luminous Flux (lm) | Luminous flux increment rate (100%) | Cx | Cy |
|---|---|---|---|---|
| Related art (silicon + TiO2) | 338 | 100% | 0.3301 | 0.3508 |
| Embodiment (Silicon + BN) | 362 | 107% | 0.3309 | 0.3464 |

As described above, according to an embodiment, the protective layer 113 may be formed by mixing silicon resin with at least one Group III nitride of BN and AlN, so that light extraction efficiency, heat radiation and electrical discharge resistance may be improved.

Figure 9:
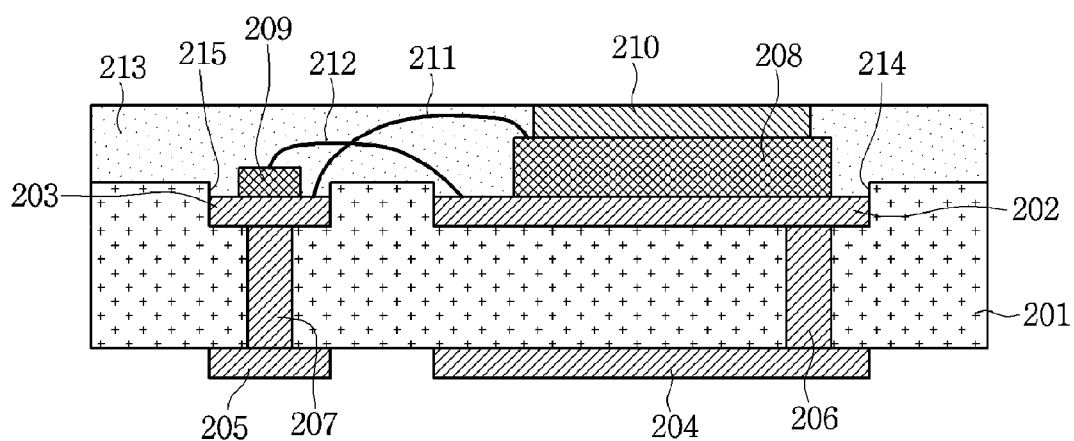
FIGS. 9 to 11 are sectional views of modified light emitting device packages of the light emitting device package in FIG. 1.
Figure 10:
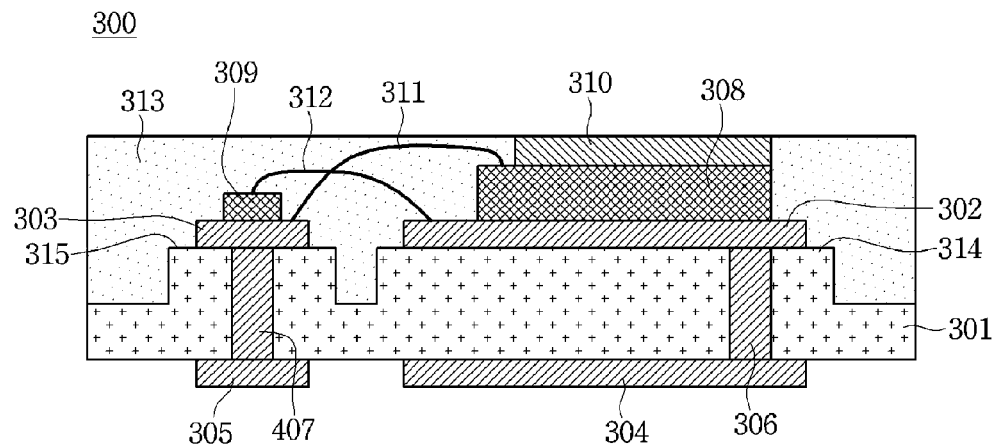
Figure 11:
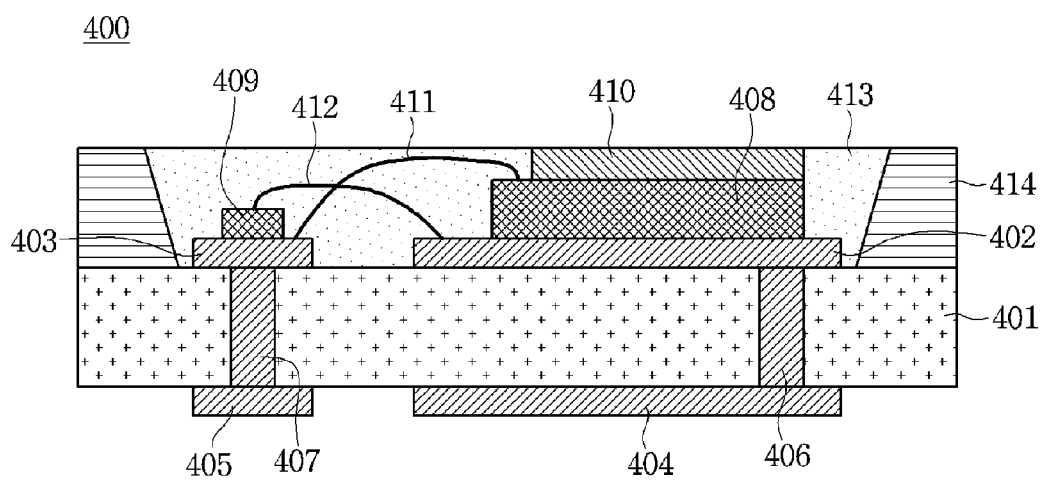

FIGS. 9 to 11 are sectional views showing modified light emitting device packages of the light emitting device package in FIG. 1. Referring to FIG. 9, the light emitting device package 200 according to a first modified embodiment may include a package body 201, first to fourth circuit patterns 202 to 205, first and second vias 206 and 207, a light emitting chip 208, a zener diode 209, a phosphor layer 210, first and second connecting members 211 and 212, and a protective layer 213. The light emitting device package according to the first modified embodiment may have substantially a same structure as that of the light emitting device package according to the first embodiment, but there may be a difference in the package body 201.

First and second grooves 214 and 215 may be formed in an upper portion of the package body 201. The first circuit pattern 202 may be provided in the first groove 214. The second circuit pattern 203 may be provided in the second groove 215. That is, the first and second circuit patterns 202 and 203 may be buried patterns in the package body 201.

A width of the first groove 214 may be equal to a width of the first circuit pattern 202. Thus, an inner wall of the first groove 214 may be in direct contact with a side surface of the first circuit pattern 202, which may be inserted into the first groove 214. A width of the second groove 215 may be equal to a width of the second circuit pattern 203. Thus, an inner wall of the second groove 215 may be in direct contact with a side surface of the second circuit pattern 203, which may be inserted into the second groove 215.

A height of the first groove 214 may be greater than a height of the first circuit pattern 202. Thus, an uppermost surface of the package body 201 may be higher than a top surface of the first circuit pattern 202. Due to a difference between both heights, at least a part or portion of the light emitting chip 208 may be inserted into the first groove 214.

A height of the second groove 215 may be greater than that of the second circuit pattern 203. Thus, the uppermost surface of the package body 201 may be higher than a top surface of the second circuit pattern 203. Due to a difference between both heights, at least a part or portion of the zener diode 206 may be inserted into the second groove 215.

As described above, the package body 201 may be provided with the first and second grooves 214 and 215 and the first and second circuit patterns 202 and 203 may be provided in the first and second grooves 214 and 215 so that a volume of the entire light emitting device package 200 may be reduced.

Referring to FIG. 10, a light emitting device package 300 according to a second modified embodiment may include a package body 301, first to fourth circuit patterns 302 to 305, first and second vias 306 and 307, a light emitting chip 308, a zener diode 309, a phosphor layer 310, first and second connecting members 311 and 312, and a protective layer 313. The light emitting device package according to the second modified embodiment may have substantially the same structure as the structure of the light emitting device package according to the first embodiment, but there may be a difference in the package body 301.

First and second protrusions 314 and 315 may be formed in an upper portion of the package body 301. The first circuit pattern 302 may be provided on the first protrusion 314. The second circuit pattern 303 may be provided on the second protrusion 315. That is, the first and second circuit patterns 302 and 303 may be protrusion patterns provided on protrusions formed on the package body 301.

A width of the first protrusion 314 may be wider than a width of the first circuit pattern 302. In addition, a width of the second protrusion 315 may be wider than a width of the second circuit pattern 303. The first circuit pattern 302 and the light emitting chip 308 attached on the first circuit pattern 302 may be provided on the first protrusion 314, and the second circuit pattern 303 and the zener diode 309 attached on the second circuit pattern 303 may be provided on the second protrusion 315. Therefore, the heat generated from the light emitting chip 308 and the zener diode 309 may be effectively dissipated through the first and second protrusions 314 and 315.

Referring to FIG. 11, a light emitting device package 400 according to a third modified embodiment may include a package body 401, first to fourth circuit patterns 402 to 405, first and second vias 406 and 407, a light emitting chip 408, a zener diode 409, a phosphor layer 410, first and second connecting members 411 and 412, a protective layer 413, and a side wall member 414. The light emitting device package according to the third modified embodiment may have substantially the same structure as the structure of the light emitting device package according to the first embodiment, but there may be a difference in the side wall member 414, which may be provided.

The protective layer 413 may be formed on the package body 401 and in a first area of an upper area of the package body 401. The side wall member 414 may be formed on the package body 401 and in a remaining area of the upper area of the package body 401 except for the first area, that is, a second area. The first area may be a central area of the package body 401. The first area may be an area in which the first and second circuit patterns 402 and 403 may be formed in the upper area of the package body 401. The second area may be an outer area of the upper area of the package body 401. Thus, the second area may exist at both sides of the first area, which may be provided between plural areas of the second area.

Thus, the side wall member 414 may cover a circumference of the protective layer 413. The side wall member 414 may be a reflective wall that reflects a part or portion of the light non-reflected upon the protective layer 413, but the embodiment is not limited thereto. A side surface of the side wall member 414 may be inclined with respect to a major surface of the second protective layer at an inclination angle. For example, the inclination angle of the side wall member 414 may be greater than 45 degrees and less than 90 degrees.

The side wall member 414 may be formed of a ceramic based material. For example, the side wall member 414 may include a second metallic oxide in a first metallic oxide as a reflective material. The second metallic oxide may be formed of a material having a refractive index different from a refractive index of the first metallic oxide. For example, the second metallic oxide may be formed of a material having a refractive index greater than that of the first metallic oxide.

The first metallic oxide may include a material having a refractive index less than 2, for example, $Al_2O_3$. The second metallic oxide may include a material having a refractive index of 2 or more, for example, $TiO_2$. The second metallic oxide may include at least one of $SnO_2$, $ZnO$ and $Ta_2O_5$ as a material different from the above. The second metallic oxide may be formed of a material having a refractive index 0.3 times greater than that of the first metallic oxide.

The second metallic oxide may be added to the first metallic oxide at contents of 30% or more. For reflectance, the second metallic oxide may be added to the first metallic oxide at contents of about 50~95%. A reflectance of the side wall member 414 may vary depending on the amount of the second metallic oxide added to the first metallic oxide.

Figure 12:
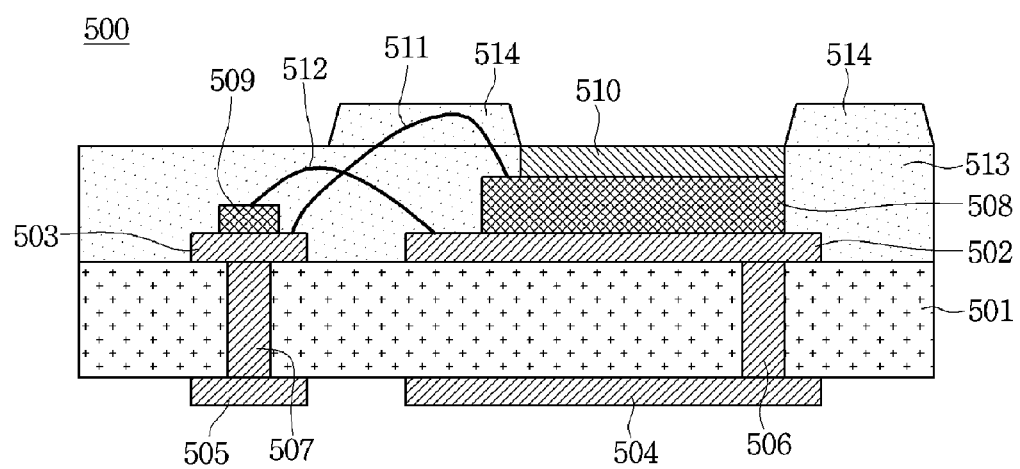
FIG. 12 is a sectional view showing a light emitting device package according to a second embodiment.

FIG. 12 is a sectional view showing a light emitting device package according to a second embodiment. Referring to FIG. 12, the light emitting device package 500 according to the second embodiment may include a package body 501, first to fourth circuit patterns 502 to 505, first and second vias 506 and 507, a light emitting chip 508, a zener diode 509, a phosphor layer 510, first and second connecting members 511 and 512, and first and second protective layers 513 and 514. The package body 501 may include a ceramic insulating layer, but the embodiment is not limited thereto. The ceramic insulating layer constituting the package body 501 may be include nitride or oxide. For example, the package body 501 may include $SiO_2$, $Si_xO_y$, $Si_3N_4$, $Si_xN_y$, $SiO_xN_y$, $Al_2O_3$ or AlN, but the embodiment is not limited thereto.

The first and second circuit patterns 502 and 503 may be formed on a top surface of the package body 501, respectively, while being spaced apart from each other by a predetermined interval. The third and fourth circuit patterns 504 and 505 may be formed on a bottom surface of the package body 501, respectively, while being spaced apart from each other by a predetermined interval.

The first via 506 may pass through the top and bottom surfaces of the package body 50, such that a top end of the first via 506 may be connected to a bottom surface of the first circuit pattern 502, and a bottom end of the first via 506 may be connected to a top surface of the third circuit pattern 504. The second via 507 may pass through the top and bottom surfaces of the package body 501 such that a top end of the second via 507 may be connected to a bottom surface of the second circuit pattern 503, and a bottom end of the second via 507 may be connected to a top surface of the fourth circuit pattern 505.

The first to fourth circuit boards 502 to 505 may be a printed circuit board formed in a manufacturing process, such as, e.g., an additive process, a subtractive process, a modified semi-additive process (MSAP) or a semi-additive process (SAP), and thus, details have been omitted in the embodiment. After via holes are formed in the package body 501 by penetrating the package body 501 through a laser process, the via holes may be filled with a metallic material so that the first and second vias 506 and 507 may be formed.

The metallic material that forms the first and second vias 506 and 507 may be one selected from Cu, Ag, Sn, Au, Ni and Pd, and filling of the metallic material may be performed through one of an electroless plating scheme, a screen printing scheme, a sputtering scheme, an evaporation scheme, an electric plating scheme and dispensing scheme, or the combination thereof.

The third and fourth circuit patterns 504 and 505 may be formed to serve as an external terminal and may be connected to an external circuit, for example, a printed circuit substrate, to allow electric power to be input therethrough. Each of the first to fourth circuit patterns 502 to 505 may be formed of at least one of Ti, Cu, Ni, Au, Cr, Ta, Pt, Sn, Ag, P and a selective alloy thereof and may be formed in a single metal layer or a multiple metal layer.

The light emitting chip 508 may be provided on the first circuit pattern 502. The zener diode 509 may be provided on the second circuit pattern 503. The light emitting chip 508 may be electrically connected to the second circuit pattern 503 through the first connecting member 511. The zener diode 509 may be electrically connected to the first circuit pattern 502 through the second connecting member 512. The first and second connecting member 511 and 512 may be metallic wires. Alternatively, the light emitting chip 508 and the zener diode 509 may be bonded in a flip bonding manner.

The light emitting chip 508 may emit light from an ultraviolet band light to a visible band light. For example, the light emitting chip 108 may include a color LED chip, such as, e.g., an UV LED chip, a red LED chip, a blue LED chip, a green LED chip or a yellow green LED chip. The light emitting chip 508 may be a blue LED chip. The light emitting chip 508 may be configured as a vertical type, in which P and N electrodes may be formed on top and bottom surfaces thereof, respectively, but the embodiment is not limited thereto. The light emitting chip 508 may be configured as a horizontal type, in which all the P and N electrodes may be formed on a top surface thereof and wire-bonded to a circuit pattern through metallic wires, respectively.

The phosphor layer 510 may be provided on the light emitting chip 508. A width of the phosphor layer 510 may be narrower than a width of the light emitting chip 508 so that a space in which the first connecting member 511 may be formed. A top surface of the phosphor layer 510 may be exposed to an outside so that a part or portion of the light emitted from the light emitting chip 508 may be converted to generate light having another wavelength.

The phosphor layer 510 may be a ceramic based material and include a metal oxide, for example, $Al_2O_3$, or glass. The phosphor added to the phosphor layer 510 may include at least one of red phosphor, green phosphor, blue phosphor and yellow phosphor. For example, the phosphor may be selected from YAG, TAG, silicate, nitride and oxy-nitride based materials.

The first protective layer 513 may be formed on the package body 501. The first protective layer 513 may be formed on the package body 501 to bury or cover the first and second circuit patterns 502 and 503, the light emitting chip 508, the zener diode 509, and the first and second connecting members 511 and 512 and to cover at least a part or portion of the phosphor layer 510.

The first protective layer 513 may be formed of a composite of silicon resin and the Group III nitride. The Group III nitride may include at least one of BN and AlN. When BN is used as the Group III nitride so that BN of 28 wt % or more is mixed with the silicon resin, transmittance may be less than 3% such that light may be reflected in a whole of the visible light band. When BN of 30 wt % or more is mixed, transmittance may be less than 2% and reflectance may be 98% or more. Thus, the first protective layer 513 may be formed by adding at least one Group III nitride of BN and AlN to silicon resin. When the BN is used as the Group III nitride, BN of at least 30% may be added to the silicon resin.

The second protective layer 514 may be formed on the first protective layer 513. Although the second protective layer 514 covering a part or portion of the top surface of the first protective layer 513 is shown in the drawings, the embodiment is not limited thereto. That is, the second protective layer 514 may be formed to cover an entirety of first protective layer 513.

The second protective layer 514 may be formed on an area that does not overlap the phosphor layer 510 formed under the second protective layer 514. Thus, transfer of the light generated from the phosphor layer 510 may be prevented from being interrupted. Therefore, the second protective layer 514 may be configured to surround an upper portion of the phosphor layer 510 such that the second protective layer 514 may not overlap the phosphor layer 510.

A side surface of the second protective layer 514 may have an inclination angle with respect to a major surface. Thus, light that spreads toward a side of the phosphor layer 510 among the light generated through the phosphor layer 510 may be reflected upward from the phosphor layer 510. The second protective layer 514 may reflect the light leaked to the side of the phosphor layer 510 upward from the phosphor layer 510 and protect the first connecting member

511. Thus, the first connecting member 511 may include a first part or portion buried or provided in the first protective layer 513 and a second part or portion buried or provided in the second protective layer 514.

The first part of the first connecting member 511 may be formed at a height lower than a height of the top surface of the phosphor layer 510 and the second part of the first connecting member 511 may be formed at a height higher than a height of the top surface of the phosphor layer 510. In other words, the first connecting member 511 may protrude upward from the surface of the phosphor layer 510. That is, the uppermost portion of the first connecting member 511 may be higher than the top surface of the phosphor layer 510.

The second protective layer 514 may be formed by adding a hardener and an additive to sol-gel solution, for example, silicon resin including metal alkoxides and organo(alkoxy) silanes. The additive may include $TiO_2$, $BaSo_4$, BN and $Al_2O_3$. Thus, the second protective layer 514 may have a white color. BN or $Al_2O_3$ as the additive may have a superior reliability. Therefore, BN or $Al_2O_3$ may be used as the additive.

A cap may be manufactured in a sol-gel scheme and then, the silicon resin may be semi-hardened to perform a capping process. Thereafter, the silicon resin may be fully hardened so that the second protective layer 514 may be formed. Alternatively, after the silicon resin is semi-hardened, the sol-gel solution may be dropped onto the second part of the first connecting member 511 and then, the final hardening may be performed so that the second protective layer 514 may be formed.

The second protective layer 514 may be formed in the sol-gel scheme so that a physical property and a thermal expansion coefficient of the molding cap may be adjusted. The side surface of the second protective layer 514 may be inclined so that the luminous flux of light may also be enhanced and a correlated color temperature (A CCT) of each beam angle may be improved.

Figure 13:
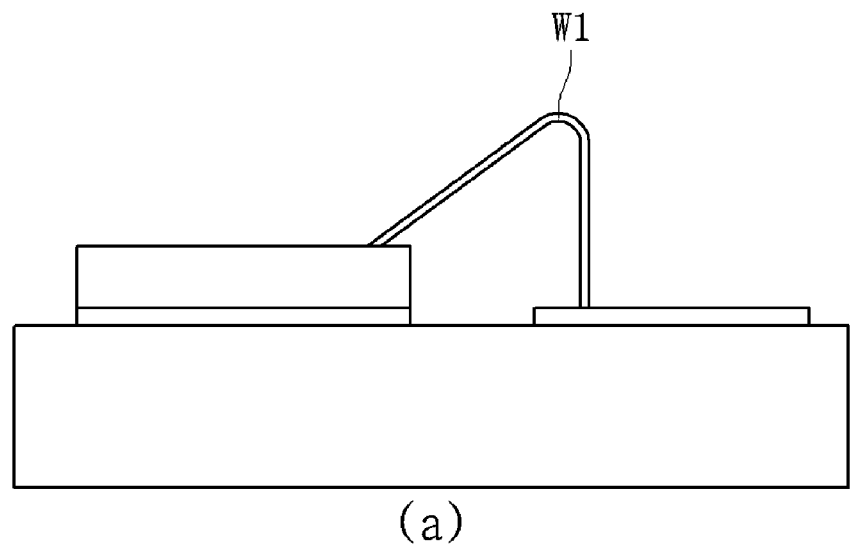
FIG. 13 shows a wire-bonding process scheme for a light emitting chip.
Figure 13:
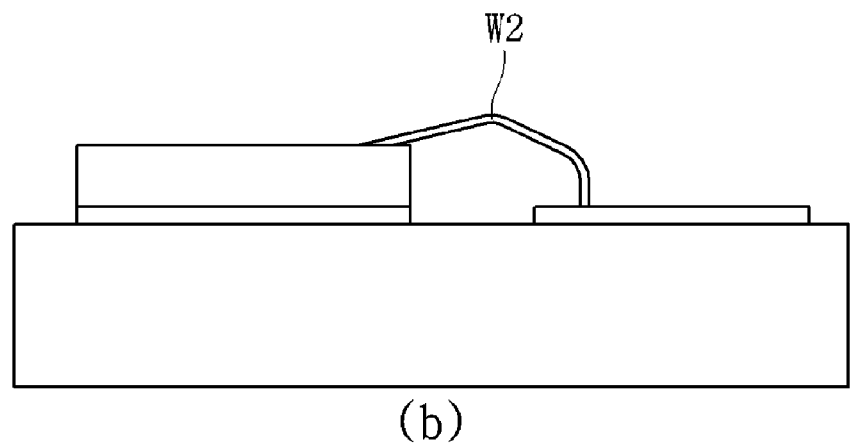
Figure 13:
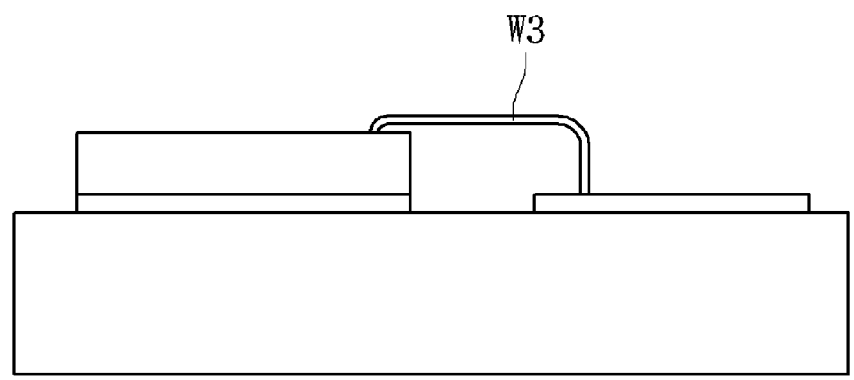

FIG. 13 shows a wire-bonding process scheme for a light emitting chip. Referring to FIG. 13, the wire bonding process may include a Q-Loop scheme as shown in 13(*a*), a spider loop scheme as shown in 13(*b*) and a normal reverse loop scheme as shown in 13(*c*). Among the schemes, the Q-Loop scheme may be a more stable scheme in reliability. However, when the Q-Loop scheme is applied, a height of a part or portion of the first connecting member 511 protruding over the light emitting chip may be about 160 μm. Thus, in order to bury or cover a protruding part or portion in the first protective layer, the phosphor layer must be formed to have a height of at least 160 μm corresponding to a height of the protruding part.

However, as a height of the phosphor is increased, the volume of the package is increased, so that the manufacturing cost is increased. In addition, as the height of the phosphor is increased, luminous flux may be reduced and light extraction performance may be deteriorated. Therefore, the spider loop or normal reverse loop scheme may be used to lower the height of the phosphor layer so that the protruding part of the first connecting member may be minimized.

However, as described above, when the wire bonding is performed through the spider loop or normal reverse loop scheme, a wire folding part may be cut off at high temperature so that reliability may be deteriorated. In addition, a manufacturing defect rate may be high due to difficulty in making the spider loop and normal reverse loop schemes.

In addition, even when the Q-loop scheme is applied, a part or portion of the protruding part may be exposed out of the first protective layer. If the protruding part is exposed, reliability may be degraded in an accelerated life reliability environment due to the exposure. Therefore, according to the embodiment, the height of the phosphor layer may be minimized while the Q-loop scheme is applied as described above and thus, the second protective layer to cover the part of the first connecting member protruding over the phosphor layer may be additionally formed on the first protective layer.

Figure 14:
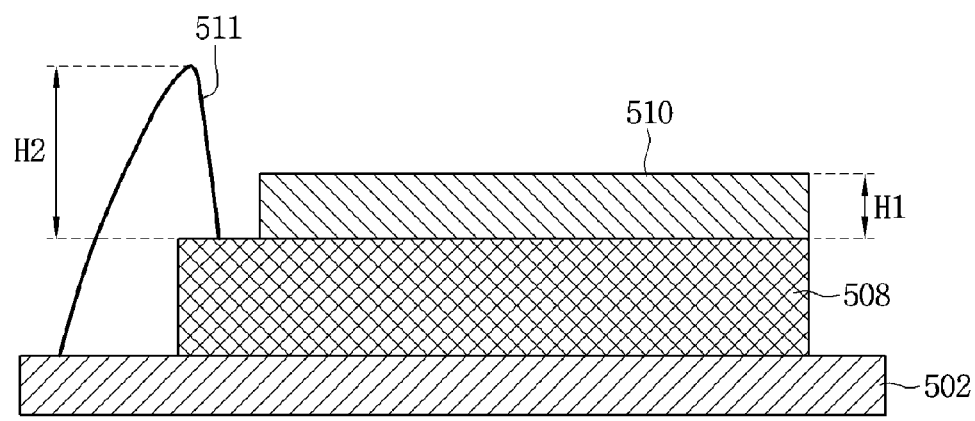
FIG. 14 is an enlarged view of a connecting member according to the second embodiment.

FIG. 14 is an enlarged view of a connecting member according to the second embodiment. Referring to FIG. 14, the phosphor layer 510 may be formed on the light emitting chip 508 to have a first height H1. The first connecting member 511 may be formed on the light emitting chip 508 to have a second height H2.

The first height H1 may be lower than the second height H2. For example, the first height H1 is less than 160 μm. According to the embodiment described above, an additive structure to cover the wire is formed on the protective layer so that the reliability of the wire may be improved while the height of the phosphor layer may be reduced.

Figure 15:
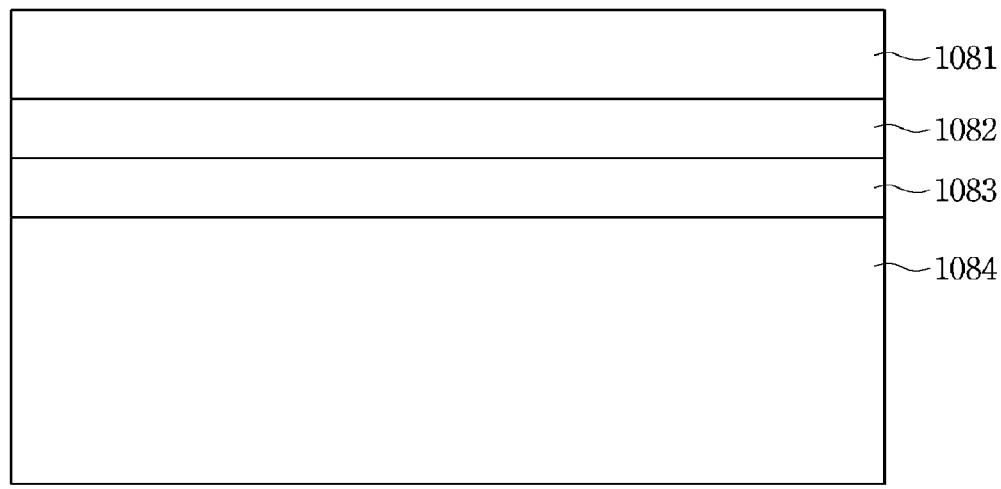
FIG. 15 is a detailed view of a light emitting chip according to an embodiment.

FIG. 15 is a detailed view of a light emitting chip according to an embodiment. The light emitting chip 108 may include a second electrode layer 1084, first and second conductive semiconductor layers 1081 and 1083, and an active layer 1082, but the embodiment is not limited thereto. The second electrode layer 1084 may include an ohmic layer, a reflective layer, a coupling layer, and a conductive substrate. The second electrode layer 1084 may be formed of at least one of Ti, Cr, Ni, Al, Pt, Au, W, Mo and an impurity-doped semiconductor substrate.

The first conductive semiconductor layer 1081 may be formed of a semiconductor compound, for example, a Group III-V or Group II-VI compound semiconductor, and doped with the first conductive dopant. When the first conductive semiconductor layer 112 is an N-type semiconductor layer, the first conductive dopant may be an N-type dopant, such as, e.g., Si, Ge, Sn, Se or Te, but the embodiment is not limited thereto. The first conductive semiconductor layer 1081 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 1082 may include at least one of a single quantum well structure, a multi quantum well (MQW) structure, a quantum wire structure and a quantum dot structure. The well layer/barrier layer of the active layer 1082 may include at least one of InGaN/GaN, InGaN/InGaN, GaN/AlGaN, InAlGaN/GaN, GaAs(InGaAs)/AlGaAs and GaP(InGaP)/AlGaP, but the embodiment is not limited thereto. The well layer may be formed of a material having a bandgap lower than that of the barrier layer.

The second conductive semiconductor layer 1083 may be formed of a semiconductor compound, for example, a Group III-V or Group II-VI compound semiconductor, and doped with the second conductive dopant. For example, the second conductive semiconductor layer 1083 may include a semiconductor material having a compositional formula of $In_xAl_yGa_{1-x-y}N$ ($0 \leq x \leq 1$, $0 \leq y \leq 1$, $0 \leq x+y \leq 1$). When the second conductive semiconductor layer 1083 is a P-type semiconductor layer, the second conductive dopant may be a P-type dopant such as Mg, Zn, Ca, Sr or Ba.

Although the first conductive semiconductor layer 1081 may be illustrated as an N-type semiconductor layer and the second conductive semiconductor layer 1083 may be illustrated as a P-type semiconductor layer in the embodiment, the embodiment is not limited thereto. In addition, a semiconductor layer having polarity opposite to that of the second conductive semiconductor layer 1083, for instance, an N-type semiconductor layer may be formed on the second conductive semiconductor layer 1083. Thus, the light emitting structure may have one of an N-P junction structure, an N-P-N junction structure and a P-N-P junction structure.

Figure 16:
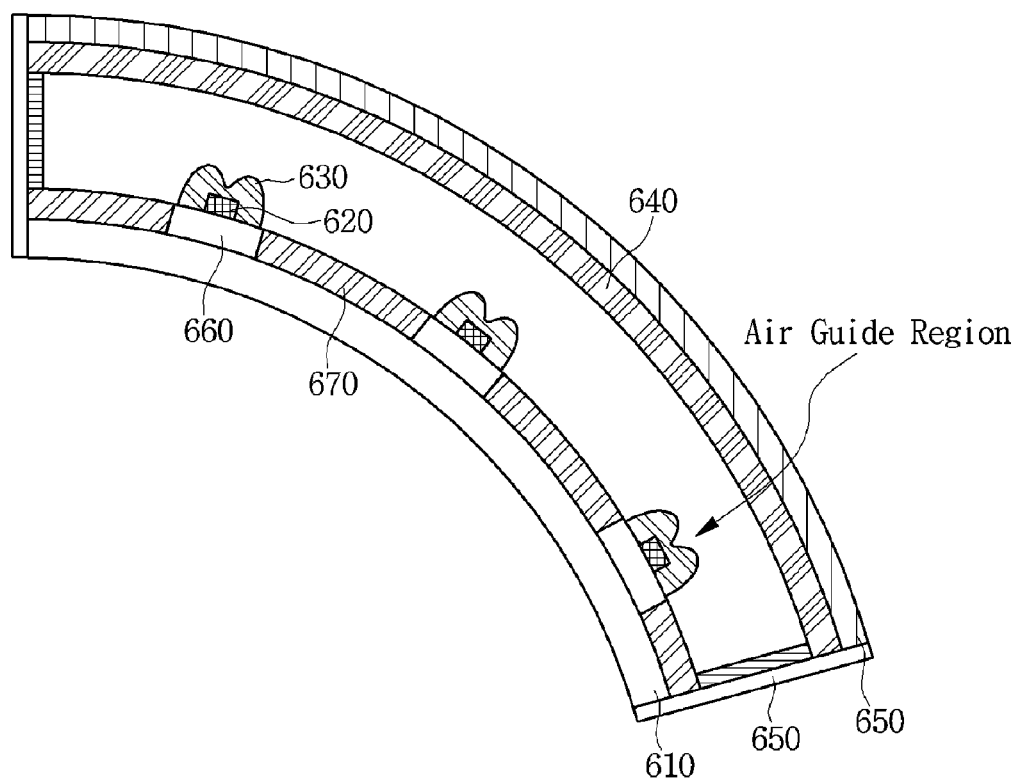
FIG. 16 shows a head lamp including a light emitting device package according to an embodiment.

FIG. 16 shows a head lamp having a light emitting device package according to an embodiment. A head lamp unit or device may include a light source module 630 including a substrate 610 and a light emitting device package 620, an optical system 640, and a cover member 650. The light source module 630 may include the substrate 610 having an electrode pattern and a plurality of light emitting device packages 620 provided on the substrate 610. Although three light emitting device packages 620 are shown in FIG. 16, the embodiment is not limited thereto.

The substrate 610 of the light source module may include a plurality of supporting portions 660 provided that correspond to each light emitting device package 620 and connecting portions 670 provided between the supporting portions 660 adjacent to each other. Thus, the substrate 610 may be formed of different materials or to have different functions.

The substrate 610 of the light source module may have a flexible property. The substrate 610 may be a PCB (Printed Circuit Board) substrate made of one selected from PET (polyethylene terephthalate), PC (polycarbonate), silicon (Si), polyimide and epoxy and may be formed in a film type.

In addition, the substrate 610 of the light source module may be formed by a single-layered PCB, a multiple-layered PCB, a ceramic substrate, a metal core PCB or a flexible PCB (FPCB). An entire area of the substrate 610 of the light source module may be formed of a same material. Alternatively, a part or portion of the entire area of the substrate 610 may be formed of a different material.

For example, the supporting portion 660 and the connecting portion 670 of the substrate 610 may be formed of the same material. For example, the supporting portion 660 and the connecting portion 670 of the substrate 610 may include a base member and a conductive pattern provided on at least one surface of the base member. The material of the base member may include a film having flexibility and insulation, such as polyimide or epoxy (for example, FR-4).

The supporting portion 660 and the connecting portion 670 of the substrate 610 may be formed of different materials. The support portion 660 of the substrate 610 selectively and multiply use a single-layered PCB a conductor, and the connecting portion 670 of the substrate 610 selectively and multiply use a single-layered PCB an insulator. In addition, the support portion 660 of the substrate 610 may be formed of a hard material inflexible to support the light emitting device package 620, and the connecting portion 670 of the substrate 610 may be formed of a soft material, which may be flexible such that the substrate 610 of the light source module may be manufactured to be applicable to a curved target object.

A reflective coating film or reflective coating material layer may be formed on the substrate 610 of the light source module such that the light generated from the light emitting device package 620 may be reflected toward the optical system 640. The reflective coating film or reflective coating material layer may include metal or metallic oxide having high reflectance, such as, e.g., Al, Ag, Au or $TiO_2$.

Alternatively, the substrate 610 of the light source module may be provided with a plurality of heat radiation pins to radiate the heat generated from the light emitting device package 620. For example, although the plurality of heat radiation pins may be provided on the entire area including the support portions 660 and the connecting portions 670, the heat radiation pins may be provided in the support portions 660 of the substrate 610 for supporting the light emitting device package 620.

In addition, the substrate 610 of the light source module may be inclined to a reference line at a predetermined angle. According to an embodiment, since the substrate 610 is flexible, at least two light emitting device packages may be formed such that angles between normal lines to the attached surface of the substrate and the reference line may be different from each other. Thus, it may be structurally easy to install the light source module to a curved surface, for example, a curved surface of a vehicle, and optically uniform light may be emitted.

According to the embodiment, the protective layer may be formed of a composite of at least one Group III nitride of silicon resin, BN, and AlN, so that light extraction efficiency, heat radiation and electrical discharge resistance may be improved.

According to the embodiment described above, an additive structure to bury or cover the wire may be formed on the protective layer, so that the reliability of the wire may be improved while the height of the phosphor layer may be reduced.

Embodiments disclosed herein provide a light emitting device package having a new structure. Embodiments disclosed herein provide a light emitting device package, which may be capable of improving light extraction efficiency and increasing a heat radiation effect by forming a protective layer of a material having high reflection and heat radiation performance. Embodiments disclosed herein provide a light emitting device package, which may be capable of improving the reliability of a wire while reducing the height of a phosphor layer.

According to an embodiments disclosed herein, a light emitting device package may include a package body, a circuit pattern on the package body, a light emitting chip on the circuit pattern, a connecting member or connector to connect the light emitting chip to the circuit pattern, a phosphor layer on the light emitting chip, and a first protective layer provided on the package body to bury the circuit pattern, the light emitting chip and the connecting member and including Group III nitride.

The Group III nitride may include at least one of boron nitride and aluminum nitride. The first protective layer may include silicon resin and the boron nitride of the Group III nitride and may have a white color. The first protective layer may include a composite of silicon resin and the boron nitride of the Group III nitride and may have a white color. At least 30 wt % of the boron nitride may be added to the silicon resin in the first protective layer.

The first protective layer may have a reflectance of at least 98%. A top surface of the first protective layer may be aligned on a same plane with a top surface of the phosphor layer. The light emitting device package may further include a second protective layer on the first protective layer.

The connecting member or connector may include a first part or portion that protrudes upward from the phosphor layer and a second part or portion except for the first part. The first part of the connecting member may be buried or provided in the first protective layer, and the second part of the connecting member may be buried or provided in the second protective layer.

The phosphor layer may have a height lower than 160 μm. A side surface of the second protective layer may be inclined with respect to a major surface of the second protective layer at a predetermined inclination angle. The second protective layer may have a bottom surface which may not be in contact with a top surface of the phosphor layer. The second protective layer may include silicon resin and at least one additive of $TiO_2$, $BaSo_4$, BN and $Al_2O_3$ added to the silicon resin.

According to embodiments disclosed herein, a light emitting device package may include a package body, a circuit pattern on the package body, a light emitting chip on the circuit pattern, a connecting member or connector to connect the light emitting chip to the circuit pattern, a phosphor layer on the light emitting chip, a first protective layer provided on the package body to bury the circuit pattern and the light emitting chip, a second protective layer on the first protective layer. The connecting member or connector may include a first part or portion that protrudes upward from the phosphor layer and a second part or portion except for the first part. The first part of the connecting member may be buried or provided in the first protective layer, and the second part of the connecting member may be buried or provided in the second protective layer.

The first protective layer may include at least 30 wt % of boron nitride added to silicon resin. A top surface of the first protective layer may be aligned on a same plane with a top surface of the phosphor layer. A side surface the second protective layer may be inclined with respect to a major surface of the second protective layer at a predetermined inclination angle, and the second protective layer may have a bottom surface which may not be in contact with a top surface of the phosphor layer.

The protective layer may be formed of a composite of at least one Group III nitride of silicon resin, BN, and AlN, so that light extraction efficiency, heat radiation and electrical discharge resistance may be improved. In addition, according to the embodiment, an additive structure to bury or cover the wire may be formed on the protective layer so that the reliability of the wire may be improved while the height of the phosphor layer may be reduced.

It will be understood that when a layer, a film, a region, or a plate is referred to as being "on" another layer, another film, another region, or another plate, it may be "directly" or "indirectly" on the other layer, other film, other region, other plate, or one or more intervening layers may also be present. In contrast, when a part is referred to as being "directly on" another part, the intervening layer may not be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a package body;
   a circuit pattern on the package body;
   a light emitting chip on the circuit pattern;
   a connector to connect the light emitting chip to the circuit pattern;
   a phosphor layer on the light emitting chip;
   a first protective layer provided on the package body to cover the circuit pattern, the light emitting chip, and the connector, the first protective layer including a Group III nitride; and
   a second protective layer on the first protective layer,
   wherein a top surface of the first protective layer is coplanar with a top surface of the phosphor layer,
   wherein the connector includes a first portion that protrudes above a top surface of the phosphor layer and a second portion coupled to the first portion and provided below the top surface of the phosphor layer, and
   wherein the first portion of the connector is provided in the second protective layer, and the second portion of the connector is provided in the first protective layer.

2. The light emitting device package of claim 1, wherein the Group III nitride includes at least one of boron nitride and aluminum nitride.

3. The light emitting device package of claim 1, wherein the first protective layer has a white color and includes a composite of a silicon resin and a boron nitride.

4. The light emitting device package of claim 3, wherein at least 30 wt % of the boron nitride is added to the silicon resin in the first protective layer.

5. The light emitting device package of claim 3, wherein the first protective layer has a reflectance of at least 98%.

6. The light emitting device package of claim 1, wherein the phosphor layer has a height less than 160 µm.

7. The light emitting device package of claim 1, wherein a side surface of the second protective layer is inclined with respect to a major surface of the second protective layer at a predetermined inclination angle.

8. The light emitting device package of claim 1, wherein the second protective layer has a bottom surface which is not in contact with a top surface of the phosphor layer.

9. The light emitting device package of claim 1, wherein the second protective layer includes a silicon resin and at least one of $TiO_2$, $BaSo_4$, BN, and $Al_2O_3$ added to the silicon resin.

10. A light emitting device package comprising:
    a package body;
    a circuit pattern on the package body;
    a light emitting chip on the circuit pattern;
    a connector to connect the light emitting chip to the circuit pattern;
    a phosphor layer on the light emitting chip;
    a first protective layer provided on the package body to cover the circuit pattern and the light emitting chip; and
    a second protective layer on the first protective layer,
    wherein the connector includes a first portion that protrudes above a top surface of the phosphor layer and a second portion coupled to the first portion and provided below the top surface of the phosphor layer, and
    wherein the first portion of the connector is provided in the second protective layer, and the second part of the connector is provided in the first protective layer.

11. The light emitting device package of claim 10, wherein the first protective layer is formed of a composite including a silicon resin and at least one of a boron nitride and an aluminum nitride.

12. The light emitting device package of claim 11, wherein the first protective layer includes the boron nitride, and at least 30 wt % of the boron nitride is added to the silicon resin.

13. The light emitting device package of claim 10, wherein a top surface of the first protective layer is aligned on a same plane with a top surface of the phosphor layer.

14. The light emitting device package of claim 10, wherein a side surface the second protective layer is inclined with respect to a major surface of the second protective layer at a predetermined inclination angle, and the second protective layer has a bottom surface which is not in contact with a top surface of the phosphor layer.

15. The light emitting device package of claim 10, wherein the second protective layer exposes a top surface of the phosphor layer.

* * * * *